(12) United States Patent
Chien et al.

(10) Patent No.: US 8,878,064 B2
(45) Date of Patent: Nov. 4, 2014

(54) FLEXIBLE PRINTED CIRCUIT BOARD

(75) Inventors: Chih-Wei Chien, New Taipei (TW); Ta-Chung Lu, New Taipei (TW); Wu Yi, Shenzhen (CN); Ming-Ge Hou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 392 days.

(21) Appl. No.: 13/249,475

(22) Filed: Sep. 30, 2011

(65) Prior Publication Data
US 2012/0268904 A1    Oct. 25, 2012

(30) Foreign Application Priority Data
Apr. 22, 2011 (CN) .......... 2011 1 0101977

(51) Int. Cl.
  *H01B 7/00* (2006.01)
  *H05K 1/18* (2006.01)
  *H05K 1/02* (2006.01)

(52) U.S. Cl.
  CPC .......... *H05K 1/189* (2013.01); *H05K 2201/052* (2013.01); *H05K 2201/10446* (2013.01); *H05K 1/0245* (2013.01); *H05K 2201/10189* (2013.01)
  USPC ................ 174/113 R; 174/117 R; 174/117 F; 174/117 FF; 174/74 R

(58) Field of Classification Search
  USPC .......... 174/36, 110 R, 113 R, 113 M, 117 R, 174/117 F, 117 FF
  See application file for complete search history.

(56) References Cited

U.S. PATENT DOCUMENTS

| | | | | |
|---|---|---|---|---|
| 4,845,315 A | * | 7/1989 | Stopper | 361/827 |
| 4,878,908 A | * | 11/1989 | Martin et al. | 623/1.54 |
| 5,651,694 A | * | 7/1997 | Miyasaka et al. | 439/492 |
| 5,895,889 A | * | 4/1999 | Uchida et al. | 174/72 A |
| 6,392,148 B1 | * | 5/2002 | Ueno et al. | 174/72 A |
| 6,413,103 B1 | * | 7/2002 | Merz et al. | 439/98 |
| 6,630,625 B1 | * | 10/2003 | Akashi et al. | 174/72 A |
| 6,631,559 B2 | * | 10/2003 | Ueno | 29/861 |
| 6,702,607 B2 | * | 3/2004 | Kondo | 439/498 |
| 6,878,341 B2 | * | 4/2005 | Kowallis et al. | 422/63 |
| 7,199,487 B2 | * | 4/2007 | Hayes | 307/10.1 |
| 7,267,552 B2 | * | 9/2007 | Lin et al. | 439/67 |
| 7,968,796 B2 | * | 6/2011 | Chang et al. | 174/117 F |

* cited by examiner

*Primary Examiner* — William H Mayo, III
(74) *Attorney, Agent, or Firm* — Novak Druce Connolly Bove + Quigg LLP

(57) ABSTRACT

A flexible printed circuit board (FPCB) includes a main portion and a number of interfaces connected to the main portion. The main portion incorporates a low-voltage differential signal (LVDS) cable and at least one function cable. The main portion includes a first connecting strip, a second connecting strip, and a third connecting strip, which are all connected together at one end. The interfaces includes a first interface connected to the first connecting strip, a second interface connected to the second connecting strip, and a third interface connected to the third connecting strip. The first interface incorporates a LVDS interface and a function module interface. The second interface is a LVDS interface. The third interface is a function module interface.

12 Claims, 3 Drawing Sheets

FLEXIBLE PRINTED CIRCUIT BOARD

BACKGROUND

1. Technical Field

The present disclosure generally relates to flexible printed circuit boards (FPCB), and particularly, to an FPCB incorporating a low-voltage differential signal (LVDS) cable and a function module cable.

2. Description of the Related Art

LVDS cables are widely used in electronic devices, such as a notebook computer. The LVDS cables are used to connect a motherboard to a display, thereby enabling transmission of image signals and power signals. The LVDS cables used in the notebook computer are generally cylindrical coaxial cables, which are expensive, requiring special connectors, and taking up a lot of space. Additionally, coaxial cables are sleeved with plastic sheath or outer casing which complicates manufacturing and adds to costs. Furthermore, cameras, antennas, audio players and other function modules may also be connected to the motherboard by LVDS cables, thereby further complicating things and adding to expenses.

Therefore, there is room for improvement within the art.

BRIEF DESCRIPTION OF THE DRAWING

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
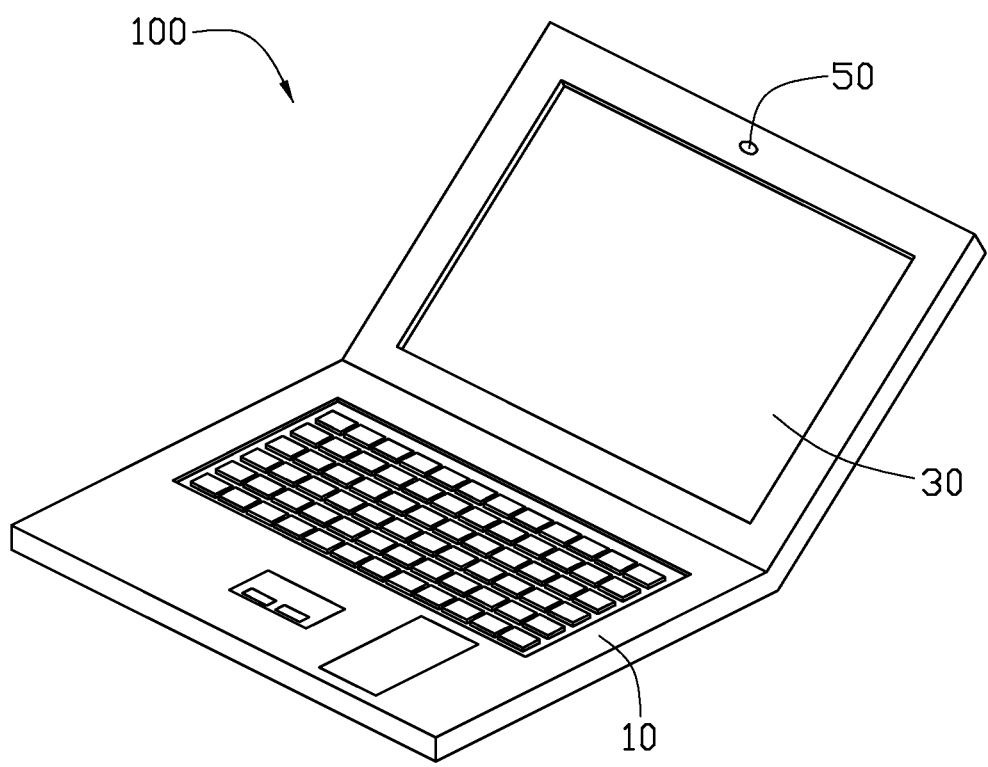
FIG. 1 is an isometric view of an embodiment of an electronic device.
Figure 2:
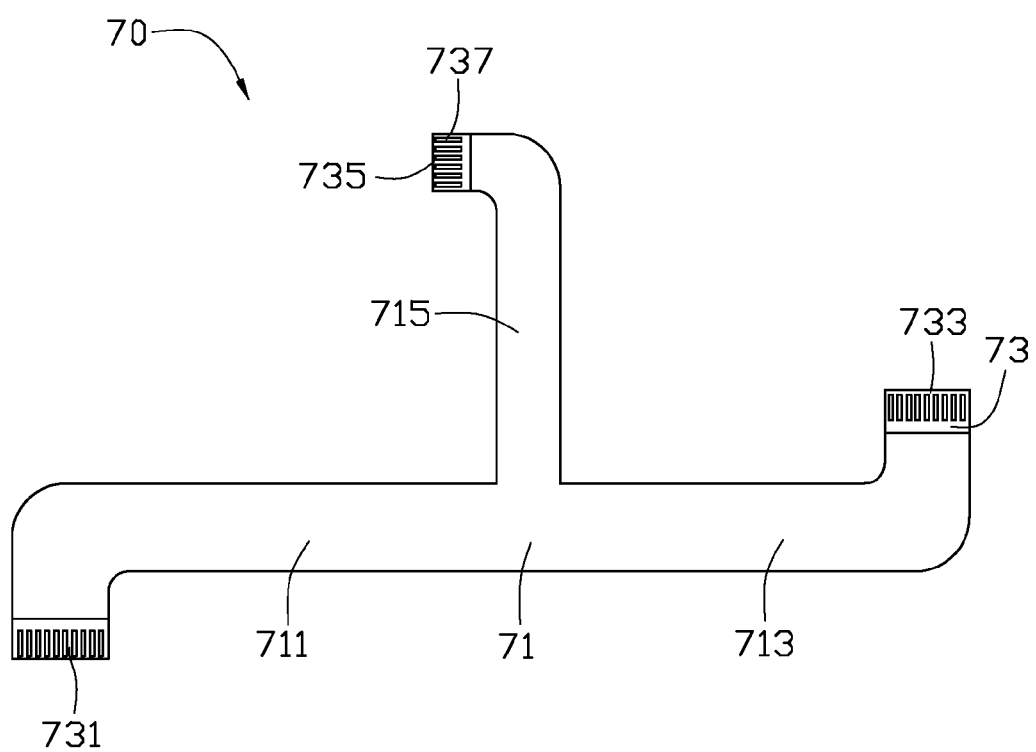
FIG. 2 is an embodiment of an FPCB used in the electronic device of FIG. 1.
Figure 3:
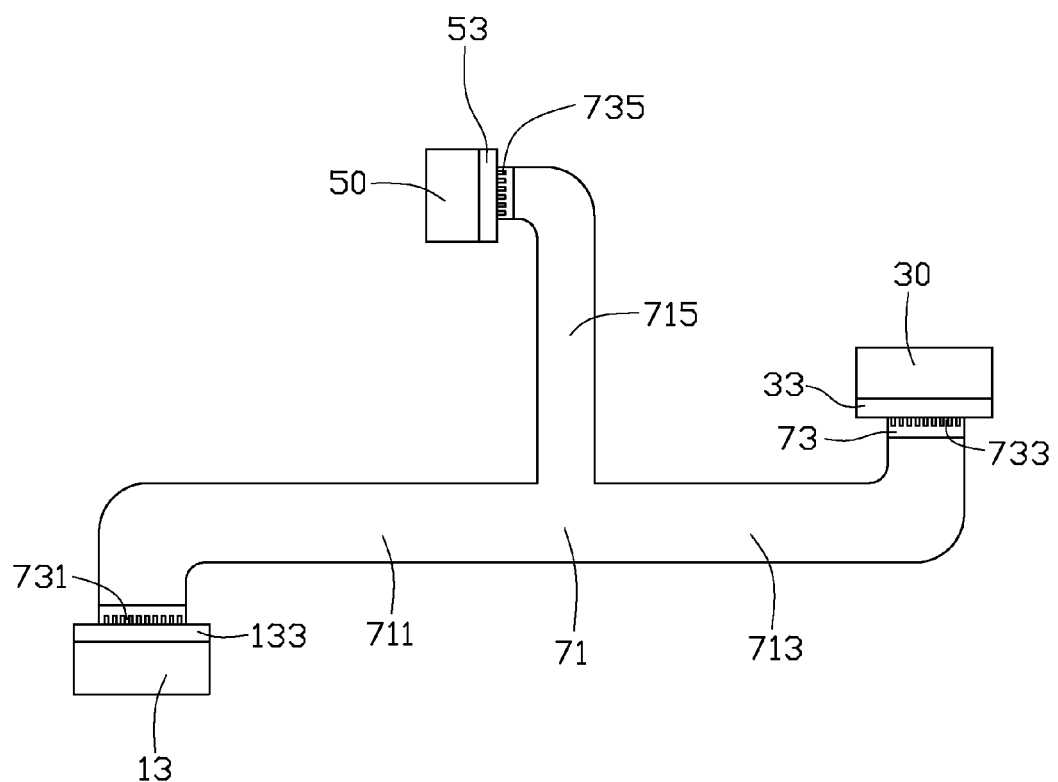
FIG. 3 is similar to FIG. 2, but the FPCB is connected to a plurality of interfaces respectively.

Referring to the FIGS. 1 through 3, an embodiment of an electronic device 100 includes a main body 10, a display 30, a function module 50, and a flexible printed circuit board (FPCB) 70. A circuit board 13 is positioned in the main body 10, and has a circuit interface 133 (as shown in FIG. 3). The display 30 is rotatably connected to the main body 10, and has a display interface 33. The function module 50 is configured to realize or perform different functions for the electronic device 100, such as photographing function, audio function, communication function, and so on. The function module 50 is positioned adjacent to the top of the display 30, and has a function module interface 53. In the illustrated embodiment, the function module 50 is a camera, and the function module interface 53 is a camera interface. The FPCB 70 is positioned in the electronic device 100, and connected to the circuit interface 133, the display interface 33, and the function module interface 53, respectively.

The FPCB 70 is strip-shaped, and includes a main portion 71 and a plurality of interfaces 73 connected to the main portion 71. The main portion 71 incorporates a low-voltage differential signal (LVDS) cable and a function module cable. In the illustrated embodiment, the function module cable is for a camera module. The FPCB 70 includes a first connecting strip 711, a second connecting strip 713, and a third connecting strip 715. The first connecting strip 711 and the second connecting strip 713 are connected to each other and aligned in a straight line, and the third connecting strip 715 is perpendicularly connected to the first connecting strip 711. The interfaces 73 include a first interface 731 connected to the first connecting strip 711, a second interface 733 connected to the second connecting strip 713, and a third interface 735 connected to the third connecting strip 715, and all of the interfaces 731, 733, 735 have connecting fingers 737. The first interface 731 is connected to the circuit interface 133, and incorporates an LVDS interface and a function module interface. The second interface 733 is an LVDS interface, and is connected to the display interface 33. The third interface 735 is a function module interface, and is connected to the function module 50.

In assembling the FPCB 70 to the electronic device 100, the FPCB 70 is partially received in the main body 10, with the first interface 731 connected to the circuit interface 133 of the circuit board 13. Then, the second connecting strip 713 and the third connecting strip 715 extend outward of the main body 10, and are received in the display 30. The second interface 733 is connected to the display interface 33 of the display 30, and the third interface 735 is connected to the function module interface 53 of the function module 50. It should be understood that, the FPCB 70 may be bent, cut or stacked in the assembly process.

The FPCB 70 incorporates the LVDS cable and function module cable to replace the conventional cylindrical coaxial cables, therefore, the manufacturing costs of the electronic device 100 are greatly reduced. Furthermore, the FPCB 70 has a relatively small size, and thus the electronic device 100 can be made smaller or incorporate additional modules.

It should be appreciated that, the FPCB 70 may incorporate the LVDS cable with other function module cables, such as an antenna cable, an audio cable, and a signal light cable. Correspondingly, the third interface 735 may be an antenna interface, an audio interface, a signal light interface, and so on.

While the present disclosure has been described with reference to particular embodiments, the description is illustrative of the disclosure and is not to be construed as limiting the disclosure. Therefore, various modifications can be made to the embodiments by those of ordinary skill in the art without departing from the true spirit and scope of the disclosure, as defined by the appended claims.

What is claimed is:

1. A flexible printed circuit board (FPCB), comprising:
a main portion incorporating a low-voltage differential signal (LVDS) cable and at least one function module cable, wherein the main portion comprises a first connecting strip, a second connecting strip, and a third connecting strip, the first, second, and third connecting strips are connected at one end thereof, respectively, and
a plurality of interfaces respectively connected to the main portion, wherein the interfaces comprises a first interface connected to the first connecting strip, a second interface connected to the second connecting strip, and a third interface connected to the third connecting strip; the first interface incorporates an LVDS interface and a function module interface, the second interface is an LVDS interface, and the third interface is a function module interface.

2. The FPCB of claim 1, wherein each of the first interface, the second interface, and the third interface comprises a plurality of connecting fingers.

3. The FPCB of claim 1, wherein the at least one function module cable is selected from a group consisting of a camera module cable, an antenna cable, an audio cable, and a signal light cable.

4. The FPCB of claim 1, wherein the third interface is selected from a group consisting of a camera interface, an antenna interface, an audio interface, and a signal light interface.

5. The FPCB of claim 1, wherein the first connecting strip and the second connecting strip are connected to each other and aligned in a straight line, and the third connecting strip is perpendicularly connected to the first connecting strip.

6. An electronic device, comprising:
   a main body comprising a circuit board, the circuit board having a circuit interface;
   a display connected to the main body, and having a display interface;
   a function module having a function module interface; and
   a flexible printed circuit board (FPCB), comprising:
      a main portion incorporating a low-voltage differential signal (LVDS) cable and at least one function module cable, wherein the main portion comprises a first connecting strip, a second connecting strip, and a third connecting strip, the first, second, and third connecting strips are connected with each other; and
      a plurality of interfaces respectively connected to the main portion, wherein the interfaces comprises a first interface connected to the first connecting strip, a second interface connected to the second connecting strip, and a third interface connected to the third connecting strip; the first interface incorporates an LVDS interface and a function module interface, the second interface is an LVDS interface, and the third interface is a function module interface; the first interface is connected to the circuit interface, the second interface is connected to the display interface, and the third interface is connected to the function module interface.

7. The electronic device of claim 6, wherein of the first interface, the second interface, and the third interface comprises a plurality of connecting fingers.

8. The electronic device of claim 6, wherein the at least one function module cable is selected from a group of a camera module cable, an antenna cable, an audio cable, and a signal light cable.

9. The electronic device of claim 6, wherein the third interface is selected from a group consisting of a camera interface, an antenna interface, an audio interface, and a signal light interface.

10. The electronic device of claim 6, wherein the first connecting strip and the second connecting strip are connected to each other and aligned in a straight line, and the third connecting strip is perpendicularly connected to the first connecting strip.

11. The electronic device of claim 6, wherein the function module is positioned in the display.

12. The electronic device of claim 11, wherein the first connecting strip is received in the main body, the second connecting strip and third connecting strip are received in the display.

* * * * *